(12) United States Patent
Wu et al.

(10) Patent No.: US 12,268,037 B2
(45) Date of Patent: Apr. 1, 2025

(54) TANDEM PHOTOVOLTAIC DEVICE

(71) Applicant: LONGI GREEN ENERGY TECHNOLOGY CO., LTD., Shaanxi (CN)

(72) Inventors: Zhao Wu, Shaanxi (CN); Chen Xu, Shaanxi (CN); Zifeng Li, Shaanxi (CN); Junjie Xie, Shaanxi (CN)

(73) Assignee: LONGI GREEN ENERGY TECHNOLOGY CO., LTD., Shaanxi (CN)

(*) Notice: Subject to any disclaimer, the term of this patent is extended or adjusted under 35 U.S.C. 154(b) by 163 days.

(21) Appl. No.: 18/037,286

(22) PCT Filed: Dec. 8, 2021

(86) PCT No.: PCT/CN2021/136475
§ 371 (c)(1),
(2) Date: May 16, 2023

(87) PCT Pub. No.: WO2022/127669
PCT Pub. Date: Jun. 23, 2022

(65) Prior Publication Data
US 2024/0006546 A1 Jan. 4, 2024

(30) Foreign Application Priority Data

Dec. 17, 2020 (CN) .......................... 202011497965.8

(51) Int. Cl.
*H10F 77/70* (2025.01)
*H10F 10/142* (2025.01)

(52) U.S. Cl.
CPC ......... *H10F 77/703* (2025.01); *H10F 10/142* (2025.01)

(58) Field of Classification Search
CPC .............................. H10F 77/703; H10F 10/142
See application file for complete search history.

(56) References Cited

U.S. PATENT DOCUMENTS

| 8,216,872 B1 | 7/2012 | Sheih et al. |
| 2006/0090790 A1* | 5/2006 | Kobayashi ............ H10F 77/244 |
| | | 438/98 |

(Continued)

FOREIGN PATENT DOCUMENTS

| CN | 101882637 | 11/2010 |
| CN | 103094404 | 5/2013 |

(Continued)

OTHER PUBLICATIONS

Li et al., CN 106449807 A, English Machine Translation. (Year: 2017).*

(Continued)

*Primary Examiner* — Tae-Sik Kang
(74) *Attorney, Agent, or Firm* — NIXON PEABODY LLP; Jeffrey L. Costellia

(57) ABSTRACT

Provided is a tandem photovoltaic device comprising: a top cell, a bottom cell, and a first light-trapping structure, in stacking, wherein a band-gap width of the top cell is larger than that of the bottom cell; and at least one of a second light-trapping structure located on a side of a shading surface of the bottom cell and a third light-trapping structure located on a side of a phototropic surface of the top cell; the three light-trapping structures are selected from metal or semiconductor material, and localized surface plasmons generated by the three light-trapping structures correspond to different peaks of light-wave response; and the three light-trapping structures form microstructures on a first cross section, average sizes d1, d2 and d3 of projections of the microstructures and average distances w1, w2 and w3 between the microstructures have relationships:

$$2 \leq \left(\frac{w1}{w2}\right)^2 \cdot \frac{d2}{d1} \leq 16, \text{ and/or } 2 \leq \left(\frac{w3}{w1}\right)^2 \cdot \frac{d1}{d3} \leq 16.$$

20 Claims, 7 Drawing Sheets

(56) References Cited

U.S. PATENT DOCUMENTS

| | | | |
|---|---|---|---|
| 2010/0000598 A1 | | 1/2010 | Lorenzetti et al. |
| 2010/0126567 A1 | * | 5/2010 | Kaufman ............. H10F 77/413 |
| | | | 136/252 |
| 2010/0288352 A1 | | 11/2010 | Ji et al. |
| 2012/0024345 A1 | | 2/2012 | Reisfeld et al. |
| 2014/0141561 A1 | | 5/2014 | Sachs et al. |
| 2020/0328319 A1 | | 10/2020 | Mellor et al. |

FOREIGN PATENT DOCUMENTS

| | | | | |
|---|---|---|---|---|
| CN | 106449807 | | 2/2017 | |
| CN | 106449807 A | * | 2/2017 | ....... H01L 31/02327 |
| CN | 109980021 | | 7/2019 | |
| CN | 112786730 | | 5/2021 | |
| JP | 2012-119529 | | 6/2012 | |
| KR | 1020120010919 | | 2/2012 | |
| WO | WO-2013/126434 | | 8/2013 | |

OTHER PUBLICATIONS

Chinese Office Action for App. No. 202011497965.8, mailed Mar. 11, 2022 (13 pages).

International Search Report for App. No. PCT/CN2021/136475, mailed Jan. 30, 2022 (4 pages).

Jana et al., "Enlightening surface plasmon resonance effect of metal nanoparticles for practical spectroscopic application." RSC advances, vol. 6: 86174-86211, The Royal Society of Chemistry 2016.

Japanese Office Action for App. No. 2023-532241, mailed Mar. 5, 2024 (6 pages) [English Translation].

Extended European Search Report (Application No. 21905598.5), mailed Nov. 25, 2024 (8 pages) English Translation.

* cited by examiner

TANDEM PHOTOVOLTAIC DEVICE

CROSS-REFERENCE TO RELATED APPLICATION

The present disclosure claims the priority of the Chinese patent application filed on Dec. 17, 2020, with the application number 202011497965.8 and the name "LAMINATED PHOTOVOLTAIC DEVICE", the entire content of which is incorporated herein by reference.

FIELD

The present disclosure relates to the field of solar photovoltaic technology, in particular to a tandem photovoltaic device.

BACKGROUND

A tandem photovoltaic device may divide sunlight into a plurality of bands, and successively utilize cells having gradually-decreased band gaps to absorb sunlight having different energies, from a front to a back thereof, so as to reduce energy loss in the visible light band, and improve photoelectric-conversion efficiency. Therefore, tandem photovoltaic devices have a broad application prospect.

SUMMARY

The present disclosure provides a tandem photovoltaic device, which aims to solve problems of serious optical loss and low photoelectric-conversion efficiency of the tandem photovoltaic device.

According to a first aspect of the present disclosure, there is provided a tandem photovoltaic device, and the tandem photovoltaic device includes: a top cell, a bottom cell, and a first light-trapping structure located between the top cell and the bottom cell, which are set in stacking, wherein a band-gap width of the top cell is larger than a band-gap width of the bottom cell;

the tandem photovoltaic device further includes at least one of a second light-trapping structure located on a side of a shading surface of the bottom cell and a third light-trapping structure located on a side of a phototropic surface of the top cell;

the first light-trapping structure, the second light-trapping structure, and the third light-trapping structure are all selected from any one of metal or semiconductor material, and localized surface plasmons generated by the first light-trapping structure, the second light-trapping structure, and the third light-trapping structure respectively correspond to different peaks of light-wave response;

the tandem photovoltaic device has a first cross section perpendicular to a phototropic surface of the tandem photovoltaic device, the first light-trapping structure, the second light-trapping structure, and the third light-trapping structure form discrete microstructures on the first cross section, average sizes of projections of the discrete microstructures on the phototropic surface of the tandem photovoltaic device are respectively d1, d2 and d3, and average distances between adjacent discrete microstructures thereof are respectively w1, w2 and w3; and when only two layers of light-trapping structures present, that is, the first light-trapping structure and the second light-trapping structure present or the first light-trapping structure and the third light-trapping structure present, following relationships are met, that is, the average sizes of projections of the discrete microstructures on the phototropic surface of the tandem photovoltaic device and the average distances between the adjacent discrete microstructures meet:

$$2 \leq \left(\frac{w1}{w2}\right)^2 \cdot \frac{d2}{d1} \leq 16, \text{ or } 2 \leq \left(\frac{w3}{w1}\right)^2 \cdot \frac{d1}{d3} \leq 16.$$

when three layers of light-trapping structures present, that is, at least one first cross section presents, such that the average sizes of projections of the discrete microstructures on the phototropic surface of the tandem photovoltaic device and the average distances between the adjacent discrete microstructures have following relationships:

$$2 \leq \left(\frac{w1}{w2}\right)^2 \cdot \frac{d2}{d1} \leq 16, \text{ and/or } 2 \leq \left(\frac{w3}{w1}\right)^2 \cdot \frac{d1}{d3} \leq 16.$$

The above description is only an overview of the technical solutions of the disclosure. In order to better understand the technical means of the disclosure, so as to implement the technical means according to the contents of the specification, and in order to make the above and other purposes, features and advantages of the disclosure more distinct and understandable, specific implementations of the disclosure are listed below.

BRIEF DESCRIPTION OF THE DRAWINGS

In order to more clearly illustrate technical solutions in embodiments of the disclosure, followings will briefly introduce drawings needed to be used in illustrating the embodiments of the disclosure. Apparently, the drawings in following description are only some embodiments of the disclosure. For those ordinary skilled in the field, they may further obtain other drawings according to the provided drawings without paying creative labor.

ILLUSTRATION OF REFERENCE SIGNS

1—bottom cell, 2—top cell, 21—substrate of top cell, 22—lower-transport layer of top cell, 23—upper-transport layer of top cell, 3—first light-trapping structure, 31—cross line or parallel line, 32—particle, 33—planar plate, 4—third light-trapping structure, 5—second light-trapping structure, 6—hole, 7—dielectric layer, 9—upper-functional layer, 10—lower-functional layer.

DETAILED DESCRIPTION OF THE EMBODIMENTS

The followings will describe the technical solutions in the embodiments of the application clearly and completely in combination with the drawings in the embodiments of the application. Apparently, the described embodiments are only a part of the embodiments of the application, not all of the embodiments of the application. Based on the embodiments in the application, all other embodiments obtained by the ordinary skilled in the art without paying creative labor, belong to the scope of protection in the application.

In the tandem photovoltaic device, light-absorbing is incomplete, or optical loss is severe, which reduces the photoelectric-conversion efficiency of the devices.

Figure 1:
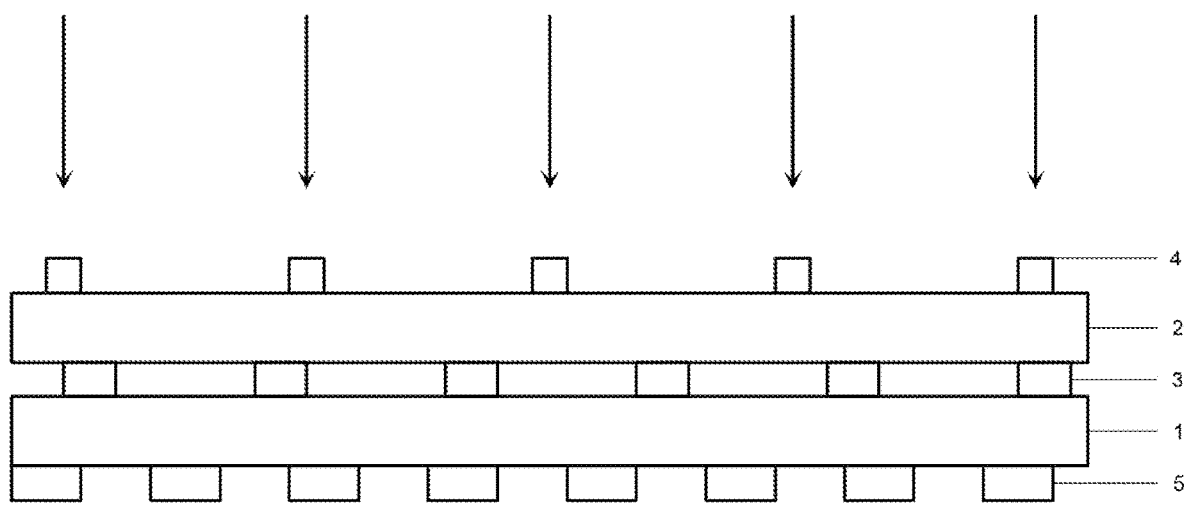
FIG. 1 is a schematic diagram showing a first type of first cross section perpendicular to a phototropic surface of a tandem photovoltaic device in an embodiment of the present disclosure.

FIG. 1 is a schematic diagram showing a first type of first cross section perpendicular to a phototropic surface of a tandem photovoltaic device in an embodiment of the present disclosure. Referring to that shown in FIG. 1, the tandem photovoltaic device includes a top cell 2, a bottom cell 1, and a first light-trapping structure 3 located between the top cell 2 and the bottom cell 1, which are set in stacking. A band-gap width of the top cell 2 is larger than a band-gap width of the bottom cell 1. For example, the band-gap width of the top cell 2 is 1.5 eV to 3 eV, and further, the band-gap width of the top cell 2 is 1.7 eV to 2.3 eV.

It should be noted that numbers of the top cell 2 and the bottom cell 1 included in the tandem photovoltaic device are not specifically limited. Specific types of the top cell 2 and the bottom cell 1 are not limited. Optionally, the top cell 2 may be a perovskite solar cell, a GaAs thin-film solar cell, a wide-band-gap CIGS (CuInxGa(1−x)Se2) solar cell, and the like. Optionally, the bottom cell 1 is a crystalline-silicon solar cell or a thin-film solar cell, and options for the bottom cell 1 are diverse.

Optionally, a phototropic surface of the bottom cell 1 is a planar structure, which facilitates setting of the first light-trapping structure 3 and the top cell 2.

The tandem photovoltaic device further includes at least one of a second light-trapping structure 5 located on a side of a shading surface of the bottom cell 1 and a third light-trapping structure 4 located on a side of a phototropic surface of the top cell 2. Specifically, whether the tandem photovoltaic device has both the second light-trapping structure 5 and the third light-trapping structure 4, or only one of them, is not specifically defined. The tandem photovoltaic device shown in FIG. 1 has both the second light-trapping structure 5 and the third light-trapping structure 4.

The first light-trapping structure 3, the second light-trapping structure 5, and the third light-trapping structure 4 are all selected from metal or semiconductor material, thus concentration of free electrons in the three is relatively high. For example, the concentration of free electrons in the three may be higher than or equal to $1\times10^{20}$ cm$^{-3}$. The free electrons in all of the three may be coupled with incident light, forming a multimode-resonant-light-trapping effect, to generate localized surface plasmons, known as LSP (Localized Surface Plasmon), which improves absorption of the incident light. It should be noted that the first light-trapping structure 3 further has a function of electrically connecting the top cell 2 and the bottom cell 1.

The localized surface plasmons generated by the first light-trapping structure 3, the second light-trapping structure 5, and the third light-trapping structure 4 correspond to different peaks of light-wave response, respectively. Thus, through cooperation of the three, the incident light in almost all of wavelength ranges is fully utilized, improving the absorption of the incident light.

The phototropic surface of the tandem photovoltaic device is a side on which the tandem photovoltaic device receives light, and a shading surface of the tandem photovoltaic device is opposite to the phototropic surface thereof. Lines with arrow in FIG. 1 are used to represent the incident light. There are countless first cross sections perpendicular to the phototropic surface of the tandem photovoltaic device. For example, that shown in FIG. 1 is a schematic diagram showing a type of the first cross section. A projection of the first cross section perpendicular to the phototropic surface of the tandem photovoltaic device, on the phototropic surface of the tandem photovoltaic device, may be parallel to any edge of the phototropic surface of the tandem photovoltaic device; or the projection of the first cross section perpendicular to the phototropic surface of the tandem photovoltaic device, on the phototropic surface of the tandem photovoltaic device, may intersect with a certain edge of the phototropic surface of the tandem photovoltaic device. In the embodiments of the present disclosure, which one the first cross section specifically is, is not specifically limited. The first cross section shown in FIG. 1 may be parallel to a certain edge of the phototropic surface of the tandem photovoltaic device.

Figure 2:
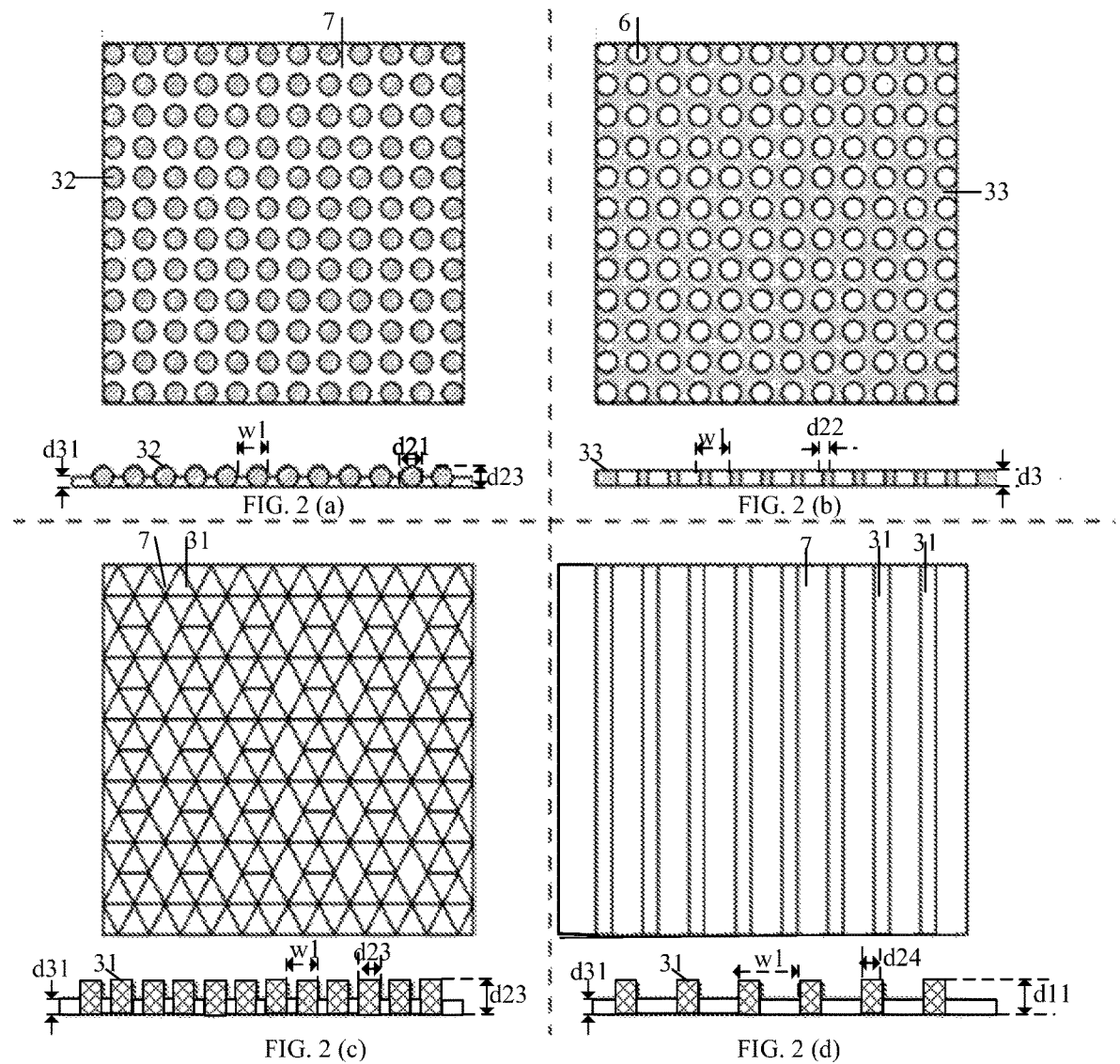
FIG. 2 (a) to FIG. (d) are schematic diagrams showing structures of a first light-trapping structure in embodiments of the present disclosure.

The first light-trapping structure 3, the second light-trapping structure 5, and the third light-trapping structure 4 form discrete microstructures on the above first cross section. Projections of the discrete microstructures on the phototropic surface of the tandem photovoltaic device may be line segments. For example, a projection of a formed discrete microstructure of the first light-trapping structure 3 on the phototropic surface of the tandem photovoltaic device is a line segment parallel to a label line of w1. Average sizes, i.e., width or diameter of the projections of the discrete microstructures respectively corresponding to the first light-trapping structure 3, the second light-trapping structure 5 and the third light-trapping structure 4, on the phototropic surface of the tandem photovoltaic device, are respectively d1, d2 and d3, and average distances between adjacent microstructures thereof are respectively w1, w2 and w3. As shown in FIG. 1, the average sizes, i.e., width or diameter of the projections of the discrete microstructures respectively corresponding to the first light-trapping structure 3, the second light-trapping structure 5 and the third light-trapping structure 4, on the phototropic surface of the tandem photovoltaic device, meet: d3<d1<d2. FIG. 2 (a) to FIG. (d) are schematic diagrams showing structures of the first light-trapping structure in the embodiments of the present disclosure. Two intersecting dashed lines among FIG. 2 (a) to FIG. (d) divide them into four parts, respectively being FIG. 2 (a), FIG. 2 (b), FIG. 2 (c), and FIG. 2 (d). In each part thereof, the one located on top is a top-view schematic diagram, and the one located at bottom is a front-view schematic diagram. The top-view is a schematic diagram showing the structure of the first light-trapping structure viewed from the phototropic surface of the tandem photovoltaic device to the shading surface thereof. The front-view is a schematic diagram showing the structure of the first light-trapping structure viewed from a direction perpendicular to the first cross section. The above front-view may further be understood as a schematic diagram showing the structure of the discrete microstructures of the first light-trapping structure, formed on the above first cross section. The FIG. 2 (a), FIG. 2 (b), FIG. 2 (c), and FIG. 2 (d) are schematic diagrams respectively showing the structures of several types of the first light-trapping structures.

Referring to that shown in FIG. 2 (a), the first light-trapping structure 3 forms the discrete microstructures on the above first cross section, as circles 32 shown in a figure located at bottom of the FIG. 2 (a). Sizes of the projections of the microstructures on the phototropic surface of the tandem photovoltaic device are d21, and an average size of the respective d21s is d1. The average distance between adjacent microstructures thereof is w1.

Referring to that shown in a figure located at bottom of the FIG. 2 (b), the first light-trapping structure 3 forms the discrete microstructures on the above first cross section, each of which is a remaining part between several adjacent holes 6 after the holes 6 are formed in the planar plate 33. After the holes 6 are formed in the planar plate 33 for the microstructures, Sizes of the projections of the remaining parts each between several adjacent holes 6 on the phototropic surface of the tandem photovoltaic device is d22, and an average size of the respective d22s is d1. After the holes 6 are formed in the planar plate 33 for the microstructures, the average distance between adjacent remaining parts each between several adjacent holes 6 is w1.

Referring to that shown in FIG. 2 (c), the first light-trapping structure 3 forms the discrete microstructures on the above first cross section, as structures 31 shown in a figure located at bottom of the FIG. 2 (c). The projections of the microstructures on the phototropic surface of the tandem photovoltaic device are cross lines. Sizes of the projections of the cross lines on the phototropic surface of the tandem photovoltaic device are d23, and an average size of the respective d23s is d1. The average distance between adjacent microstructures thereof is w1.

Referring to that shown in FIG. 2 (d), the first light-trapping structure 3 forms the discrete microstructures on the above first cross section, as structures 31 shown in a figure located at bottom of the FIG. 2 (d). The projections of the microstructures on the phototropic surface of the tandem photovoltaic device are parallel lines, Sizes of the projections of the parallel lines on the phototropic surface of the tandem photovoltaic device are d24, and an average size, i.e., width of the respective d24s is d1. The average distance between adjacent microstructures, i.e., parallel lines or strips 31 thereof is w1.

The second light-trapping structure 5 and the third light-trapping structure 4 form the discrete microstructures on the above first cross section, which are similar to that first light-trapping structure 3 forms the discrete microstructures on the above first cross section, and in order to avoid repetition, they will not be repeated here. Average sizes of the projections of the discrete microstructures of the second light-trapping structure 5 and the third light-trapping structure 4, on the phototropic surface of the tandem photovoltaic device, are respectively d2 and d3. The average distances between adjacent microstructures of the second light-trapping structure 5 and the third light-trapping structure 4 are respectively w2 and w3. The above d2 and d3 are similar to the above d1, the above w2 and w3 are similar to the above w1, to avoid repetition, they will not be repeated here.

In a first aspect, referring to that shown in FIG. 1, the first light-trapping structure 3 forms the discrete microstructures on the above first cross section. The average size of the projections of the discrete microstructures on the phototropic surface of the tandem photovoltaic device, is d1, and 500 nm≥d1≥10 nm. Specifically, d1 may be taken as 10 nm, 20 nm, 30 nm, 40 nm, 50 nm, 100 nm, 150 nm, 200 nm, 250 nm, 300 nm, 350 nm, 400 nm, 450 nm, 500 nm, etc. The average distance between adjacent microstructures of first light-trapping structure 1 formed on the above first cross section, is w1, and 800 nm≥w1≥10 nm. The sizes of all of the microstructures of the first light-trapping structure 3 are relatively small, such that, after the incident light enters the tandem photovoltaic device, the light enters a lower part of the first light-trapping structure 3 through scattering, and undergoes a plurality of reflections, making a shielding effect of the first light-trapping structure 3 relatively small, thus increasing amount of the incident light and thereby increasing an optical path thereof, such that the photoelectric-conversion efficiency of tandem photovoltaic device is improved. For the above average size and average distance, degrees of dispersion thereof are not limited. Preferably, considering an actual situation of process, 500 nm≥d1≥100 nm, a distribution of the sizes meets a normal distribution, and a corresponds to d1±20%, that is, a probability that the size is within a range of d1±20%, is 68.2%, and a probability that the size is within a range of d1±40%, is 95.4%.

In a second aspect, referring to shown in FIG. 1, the first light-trapping structure 3 having high concentration of free electrons, the sizes of the microstructures of which are relatively small, is coupled to the incident light, to form the multimode-resonant-light-trapping effect. The first light-trapping structure 3 is coupled to the incident light, to generate a phenomenon of localized-plasma-mode enhancement located on a surface of the first light-trapping structure 3. The incident light is restricted by the localized-plasma-mode enhancement, thus presenting in a peripheral region of the surface of the first light-trapping structure 3, which produces a light-trapping effect. In a condition that an absorption layer of the top cell 2 and/or the bottom cell 1 is located in the peripheral region of the surface of the first light-trapping structure 3, it may enable carriers to be separated and collected within a relatively-short migration distance, which is conducive to improving the photoelectric-conversion efficiency of the tandem photovoltaic device.

In a third aspect, referring to that shown in FIG. 1, the first light-trapping structure 3 is coupled to the incident light, generating surface plasmons that convert the incident light into a waveguide mode that transmits laterally, which changes a transmitting direction of the incident light, and greatly increases the optical path of the incident light. The incident light transmitted laterally is basically located near an interface of a phototropic surface of the first light-trapping structure 3, which may effectively improve the light-trapping effect, thus, an excellent light-absorbing effect may be achieved through a relatively-small thickness of the absorption layer, which may reduce thicknesses of the absorption layers in the respective cells, thereby reducing thicknesses of the respective cells, thus reducing an overall thickness of the tandem photovoltaic device.

The above second light-trapping structure 5 and third light-trapping structure 4 have a light-trapping effect similar to that of the above first light-trapping structure 3.

For the third light-trapping structure, the average size of the projections of the discrete microstructures on the phototropic surface of the tandem photovoltaic device is d3, and 300 nm≥d3≥1 nm. Specifically, d3 may be taken as 1 nm, 2 nm, 3 nm, 4 nm, 5 nm, 6 nm, 7 nm, 8 nm, 9 nm, 10 nm, 50 nm, 100 nm, 150 nm, 200 nm, 250 nm, 300 nm, etc. The distance between the adjacent discrete microstructures of the third light-trapping structure formed on the above first cross section is w3, and 500 nm≥w3≥1 nm.

For the above average size and average distance, the degrees of dispersion thereof are not limited. Preferably, considering an actual situation of process, 300 nm≥d3≥50 nm, a distribution of the sizes meets a normal distribution, and a corresponds to d3±20%, that is, a probability that the size is within a range of d3±20%, is 68.2%, and a probability that the size is within a range of d3±40%, is 95.4%.

For the above second light-trapping structure, the average size of the projections of the discrete microstructures on the phototropic surface of the tandem photovoltaic device is d2, and 1200 nm≥d2≥20 nm. The distance between the adjacent discrete microstructures of the second light-trapping structure formed on the above first cross section is w2, and 50 μm≥w2≥20 nm.

For the above average size and average distance, the degrees of dispersion thereof are not limited. Preferably, considering an actual situation of process, 1200 nm≥d2≥300 nm, a distribution of the sizes meets a normal distribution, and a corresponds to d2±20%, that is, a probability that the size is within a range of d2±20%, is 68.2%, and a probability that the size is within a range of d2±40%, is 95.4%.

That is, 300 nm≥d3≥50 nm, 500 nm≥d1≥100 nm, and 1200 nm≥d2≥300 nm. The three layers of light-trapping structures may generate a plasmon effect respectively for an ultraviolet and blue light band, a visible light band, and a red light and infrared band.

The peaks of light-wave response corresponding to the second light-trapping structure 5 and the third light-trapping structure 4 are different from that corresponding to the first light-trapping structure 3, thus, the second light-trapping structure 5, the third light-trapping structure 4, and the first light-trapping structure 3 cooperate with each other, making the incident light in almost all of the wavelength ranges fully utilized, thus improving the absorption of the incident light (a basic solution has three layers of light-trapping structures).

In order to further improve an overall light-trapping effect, on a basis that the respective layers of plasmon-light-trapping structures have the multimode-resonant-light-trapping effect, matchings of the respective layers of light-trapping structures are adjusted, to make the incident light enter a lower part of an upper-layer-light-trapping structure through scattering, and undergo a plurality of reflections, which may increase the optical path to a certain extent, thus improving the overall light-trapping effect. A derivation process of a matching of scattering cross sections between two layers of light-trapping structures, is as follows:

Taking scattering of metal particles as an example, there is a normalized scattering factor, $$Q_{scat} \propto \left(\frac{1}{\lambda}\right)^4 \cdot \frac{1}{\sigma_{geom}},$$

and a part absorbed by the absorption layer, $A = 1 - \delta \cdot Q_{scat}$ wherein δ is a proportion of a coverage area of the particles. Assuming that the particle is square, a side length of the particle is $\sigma_{geom} = d$, and a distance between centers of adjacent particles is $$\sigma_{gap} = 2, \delta = \left(\frac{\sigma_{geom}}{4 \cdot \sigma_{gap}}\right)^2 = \left(\frac{d}{4w}\right)^2.$$

When the particles are located between two absorption layers, the larger the scattering factor and the smaller the proportion of the coverage area of the particles, the better the corresponding light-trapping effect.

When the structures disclosed in the present disclosure include an intermediate-scattering structure and a backscattering structure, the intermediate-scattering structure and the scattering structure aim different wavelengths. The intermediate-scattering structure aims a wave band of 400 nm to 600 nm, and the scattering structure, i.e., a surface-scattering structure aims a wave band of 200 nm to 300 nm. Assuming that both structures have a same absorption rate, the inventor concludes that a proportional relationship between sizes of the microstructures of the two structures shall be $$\left(\frac{1}{4 \cdot w1}\right)^2 \cdot d1 \cdot \left(\frac{1}{400}\right)^4 = \left(\frac{1}{4 \cdot w3}\right)^2 \cdot d3 \left(\frac{1}{200}\right)^4, \left(\frac{w3}{w1}\right)^2 \cdot \frac{d1}{d3} = 8.$$

Based on the above relationship, the inventor proposes a relationship formula (1) of proportional between different layers of structures, that is, $$2 \leq \left(\frac{w3}{w1}\right)^2 \cdot \frac{d1}{d3} \leq 16.$$

For example, the sizes for the microstructures of the intermediate structure are taken as that: d1=100 nm, w1=500 nm.

When the upper-layer structure takes: d3=50 nm, it is obtained that:

$$2 \leq \left(\frac{w3}{500}\right)^2 \cdot \frac{100}{50} \leq 16,$$

then 500 nm≤w3≤1414 nm.

A physical size of a plasmon must be much smaller than a wavelength of a wave band that the plasmon aims, so the size of the microstructures of the third light-trapping structure at a top layer is the smallest, requiring less than 300 nm, and the first light-trapping structure in the middle is less than 500 nm, and except this, there is no additional restriction on the relationship between the sizes of the microstructures of the two structures, and the restriction may only be made by relying on the above relationship formula (1). There is no restriction on the second light-trapping structure at a bottom of the device.

The above derivation process of formula may be applied to that of the first and second light-trapping structures in a same way.

The second and third light-trapping structures at the top and bottom, are not required to have electrical conductivity, and preferably, they may conduct electricity and function as surface electrodes. There is at least one first cross section in the countless first cross sections perpendicular to the phototropic surface of the tandem photovoltaic device, to make the average sizes and average distances for the microstructures of the first light-trapping structure, the second light-trapping structure, and the third light-trapping structure respectively be d1, d2 and d3, and w1, w2, and w3, and have following relationships:

$$2 \leq \left(\frac{w1}{w2}\right)^2 \cdot \frac{d2}{d1} \leq 16, \text{ and/or } 2 \leq \left(\frac{w3}{w1}\right)^2 \cdot \frac{d1}{d3} \leq 16,$$

that is, it needs to meet one of the two relationships. Preferably, the three layers of light-trapping structures meet conditions of the two formulae at the same time, such that the scattering cross sections of every two adjacent layers of light-trapping structures both match corresponding wavelengths, which may fully guarantee incoming amount of the incident light, and make less light reflected from the tandem photovoltaic device, thus further improving the absorption of the incident light. The one first cross section in the countless first cross sections perpendicular to the phototropic surface of the tandem photovoltaic device, may be a first cross section, the projection of which on the phototropic surface of the tandem photovoltaic device is parallel to any edge of the phototropic surface of the tandem photovoltaic device, in the countless first cross sections. The average sizes and average distances for the microstructures of the first light-trapping structure, the second light-trapping structure, and the third light-trapping structure may have following relationships as well, for example:

$$1.2 \le \left(\frac{w1}{w2}\right)^2 \cdot \frac{d2}{d1} \le 20, \text{ or/and } 1.2 \le \left(\frac{w3}{w1}\right)^2 \cdot \frac{d1}{d3} \le 20.$$

Those skilled in the art may adaptively design endpoint values of the above relationship formulae based on actual situations, which is not limited by the embodiments of the disclosure.

At the same time, a height of the first light-trapping structure 3 is only higher than 10 nm but less than 500 nm. Compared to a suede structure of µm level, a surface having the first light-trapping structure 3 is relatively flat, providing a better growth or deposition interface for the top cell 2. Moreover, the above first light-trapping structure 3 has a relatively-high conductivity and a relatively-high recombination rate, reducing a series resistance of the tandem photovoltaic device.

To sum up, the first light-trapping structure 3 in the embodiments of the present disclosure mainly plays a role in three aspects: a first function is to connect the top cell 2 and the bottom cell 1 in series. The first light-trapping structure 3 has the relatively-high conductivity and the relatively-high recombination rate, reducing the series resistance of the tandem photovoltaic device. A second function is, through the light-trapping effect in the above three aspect, to reduce an interface reflection and transmit light of wave band of relatively-long wavelength, to achieve excellent light-absorbing effect, and reduce the thicknesses of the absorption layers in the respective cells, thereby reducing thicknesses of the respective cells, thus reducing the overall thickness of the tandem photovoltaic device. A third function is that the phototropic surface of the bottom cell having the first light-trapping structure 3 is relatively flat, providing the better growth or deposition interface for the top cell 2.

It should be noted that the materials or the size of the first light-trapping structure 3, the second light-trapping structure 5, and the third light-trapping structure 4 may be adjusted according to sizes or materials of respective parts of the tandem photovoltaic device, to make the light-trapping structures of the first light-trapping structure 3, the second light-trapping structure 5, and the third light-trapping structure 4 are optimized, which is not specifically limited in the embodiments of the disclosure. For example, according to requirements for different structures for trapping light of different wavelength ranges in the tandem photovoltaic device, the material or the size, etc., of the first light-trapping structure 3 are adjusted, to make the light-trapping structure of the first light-trapping structure 3 optimized, thus further reducing optical loss.

Optionally, the second light-trapping structure 5 forms the discrete microstructures on the first cross section. The average size of the projections of the discrete microstructures on the phototropic surface of the tandem photovoltaic device is d2. For any first cross section, d2 is ≤1200 nm, thereby making the peak of light-wave response of the localized surface plasmons of the second light-trapping structure 5 more match a wavelength of light incident on the second light-trapping structure 5, thus further improving the absorption of the light.

Optionally, the third light-trapping structure 4 forms the discrete microstructures on the first cross section. The average size of the projections of the discrete microstructures on the phototropic surface of the tandem photovoltaic device is d3. For any first cross section, d3 is ≤300 nm, thereby making the peak of light-wave response of the localized surface plasmons of the third light-trapping structure 4 more match a wavelength of light incident on the third light-trapping structure 4, thus further improving the absorption of the light.

Optionally, the peak of light-wave response of the localized surface plasmons of the first light-trapping structure 3 is within a wavelength range of absorbed light of the bottom cell 1. After the light is incident on the first light-trapping structure 3, since the first light-trapping structure 3 has scattering on the light, the light enters the lower part of the first light-trapping structure 3 through scattering, and enters the bottom cell 1, such that energy of the light incident on the first light-trapping structure 3 basically has no loss, which may increase the optical path to a certain extent. That is, it meets:

$$2 \le \left(\frac{w1}{w2}\right)^2 \cdot \frac{d2}{d1} \le 16.$$

Optionally, the peak of light-wave response of the localized surface plasmons of the third light-trapping structure 4 is within a wavelength range of absorbed light of the top cell 2. After the light is incident on the third light-trapping structure 4, since the third light-trapping structure 4 has scattering on the light, the light enters the lower part of the third light-trapping structure 4 through scattering, and enters the top cell 2, such that energy of the light incident on the third light-trapping structure 4 basically has no loss, which may increase the optical path to a certain extent. That is, it meets:

$$2 \le \left(\frac{w3}{w1}\right)^2 \cdot \frac{d1}{d3} \le 16.$$

Optionally, referring to that shown in FIG. 2 (a) to FIG. (d), the microstructure of first light-trapping structure 3, the second light-trapping structure 5, and the third light-trapping structure 4 is selected from a particle (as 32 shown in FIG. 2 (a)), a line (as 31 shown in FIG. 2 (d)), or a hole (as shown in FIG. 2 (b)). The first light-trapping structure 3, the second light-trapping structure 5, and the third light-trapping structure 4 may have various forms.

Optionally, a shape of the above particle is one of spherical, hemispherical, linear cross structure, cylinder, and cone. A shape of the above hole is one of circle, approximately circle, and polygonal shape. The first light-trapping structure 3, the second light-trapping structure 5, and the third light-trapping structure 4 may have various forms. Referring to that shown in FIG. 2 (b), the shape of the hole 6 is circle.

Optionally, the top cell includes a first absorption layer, and the bottom cell includes a second absorption layer. A distance between the first light-trapping structure and at least the first absorption layer or the second absorption layer, is not larger than 2 nm, that is, the distance between the first absorption layer and the first light-trapping structure is d5, and d5≤2 nm; and/or the distance between the second absorption layer and the first light-trapping structure is d6, and d6≤2 nm. Generally, a region of localized-plasma-mode enhancement of the first light-trapping structure is within a range of about 2 nm around the surface of the first light-trapping structure. That is, the first absorption layer and/or the second absorption layer is set at the peripheral region of the surface of the first light-trapping structure, to make the first absorption layer and/or the second absorption layer are located exactly within the region of localized-plasma-mode enhancement of the first light-trapping structure, which is conducive to improving the photoelectric-conversion efficiency of the tandem photovoltaic device. This part mainly full utilizes the light-trapping effect in the above second aspect, of the first light-trapping structure.

Optionally, metals of the first light-trapping structure, the second light-trapping structure, and the third light-trapping structure are selected from at least one of gold, silver, aluminum, copper, gallium, and indium. The first light-trapping structure, the second light-trapping structure, and the third light-trapping structure formed by the above materials have relatively-high concentration of free electrons, which is beneficial to improving the light-trapping effect.

Optionally, semiconductor materials of the first light-trapping structure, the second light-trapping structure, and the third light-trapping structure are selected from at least one of aluminum-doped zinc oxide, and indium-doped tin oxide. The first light-trapping structure, the second light-trapping structure, and the third light-trapping structure formed by the above materials have relatively-high concentration of free electrons, which is beneficial to improving the light-trapping effect.

Figure 3:
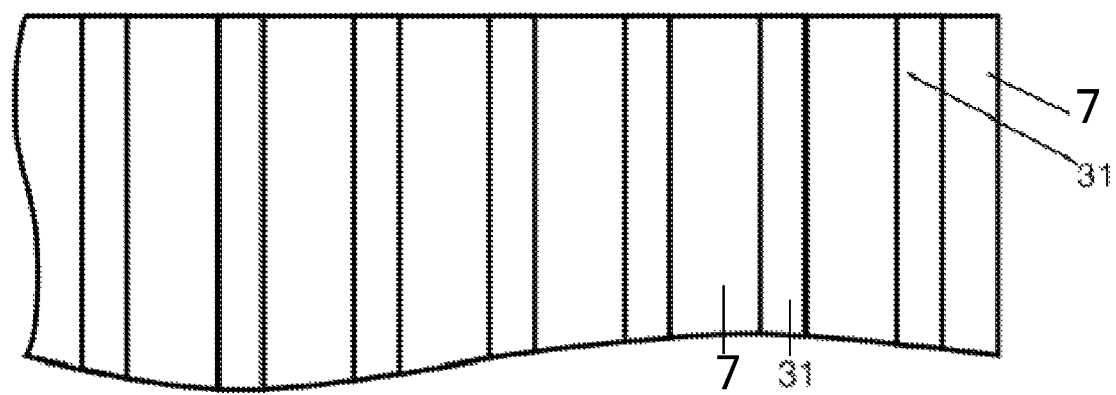
FIG. 3 is a schematic diagram showing a partial structure of a tandem photovoltaic device in an embodiment of the present disclosure.
Figure 4:
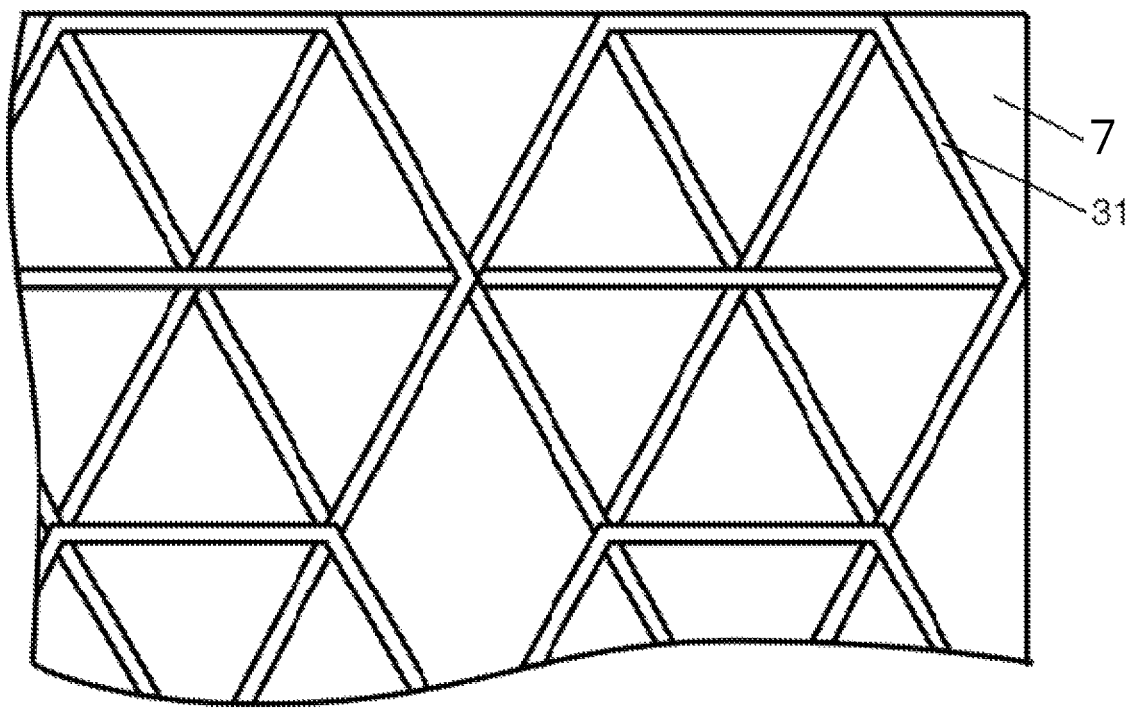
FIG. 4 is a schematic diagram showing a partial structure of another tandem photovoltaic device in an embodiment of the present disclosure.

FIG. 3 is a schematic diagram showing a partial structure of the tandem photovoltaic device in an embodiment of the present disclosure. FIG. 4 is a schematic diagram showing a partial structure of another tandem photovoltaic device in an embodiment of the present disclosure.

Referring to that shown in FIGS. 2, 3, and 4, the tandem photovoltaic device further includes a dielectric layer 7, and the dielectric layer 7 is formed of dielectric material filled in gaps among the microstructures of the first light-trapping structure 3. For example, either the dielectric layer 7 is filled in gaps among the particles 32, or the dielectric layer 7 is filled in the holes 6 in the planar plate 33. The height of the first light-trapping structure is larger than or equal to a height of the dielectric layer 7. As shown in FIG. 2 (a), a height d23 of the particles 32 is larger than a height d31 of dielectric layer 7. In FIG. 2 (b), a height d3 of the planar plate 33 is equal to the height of the dielectric layer 7. In FIG. 2 (c), a height d23 of cross lines 31 is larger than the height d31 of the dielectric layer 7. In FIG. 2 (d), a height d11 of parallel lines 31 is larger than the height d31 of the dielectric layer 7. On the one hand, through filling of the dielectric layer 7, the top cell may be prepared on a relatively-flat surface, facilitating preparation of the top cell, and reducing stress of the top cell, thus facilitating formation of the top cell of large size. On the other hand, the filling of the dielectric layer helps to enhance the multimode-resonant-light-trapping effect of the plasmon wrapped therein.

The cross line 31 in FIG. 4 is a grid structure made of silver or an alloy material of silver, a cross section thereof is approximately rectangular or trapezoidal, a width of bottom thereof (an area in contact with the phototropic surface of the bottom cell 1) is 50 nm, and a height thereof is nm, which constructs a honeycomb-grid structure. A side length of hexagonal of the honeycomb-grid structure is 300 nm to 800 nm. The grid structure is obtained by utilizing mask evaporation. Gaps among the cross lines 31 are filled with the dielectric layer 7, the dielectric layer 7 is made of silicon oxide, and a thickness of the dielectric layer 7 is 5 nm to 20 nm.

Optionally, a dielectric constant of material of the dielectric layer is 1.2 to 200, and the material of the dielectric layer is selected from at least one of silicon oxide, aluminum oxide, silicon nitride, tantalum oxide, and aluminum nitride.

Optionally, no dielectric layer may be filled in the gaps of the first light-trapping structure, which makes the distances between the first light-trapping structure, and the absorption layer of the top cell and the absorption layer of the bottom cell, relatively-small, thus full utilizing the light-trapping effect in the second aspect, of the first light-trapping structure.

Figure 5:
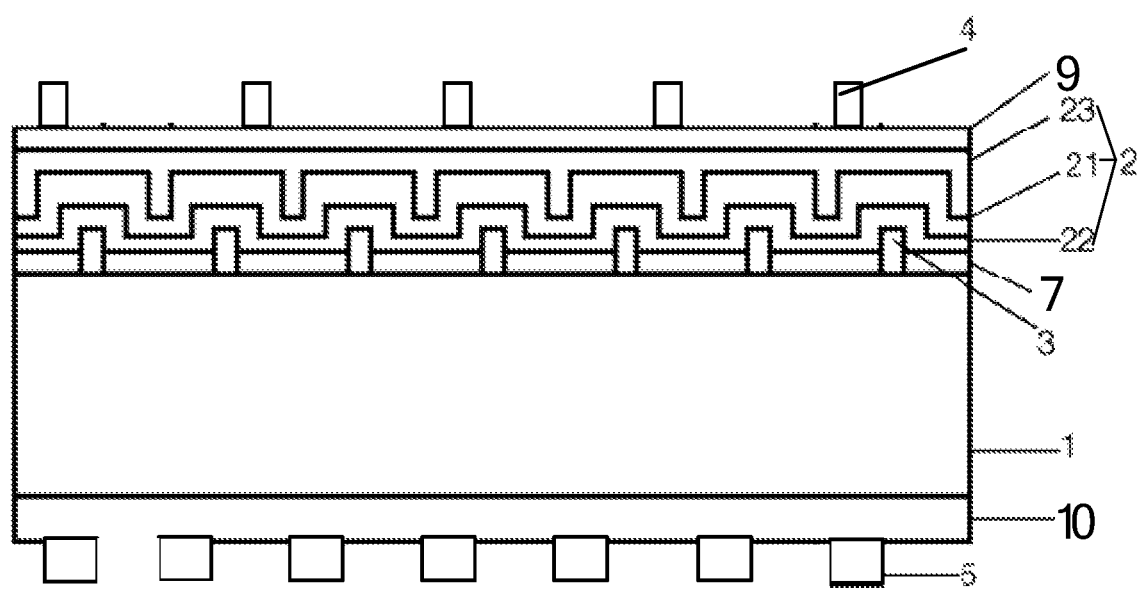
FIG. 5 is a schematic diagram showing a second type of first cross section perpendicular to a phototropic surface of a tandem photovoltaic device in an embodiment of the present disclosure.

FIG. 5 is a schematic diagram showing a second type of first cross section perpendicular to the phototropic surface of the tandem photovoltaic device in an embodiment of the present disclosure. Optionally, referring to that shown in FIG. 5, a substrate 21 of the top cell 2 includes the first absorption layer. In a condition that the first absorption layer is made of perovskite material, a thickness of the first absorption layer is 50 nm to 200 nm. Compared to that the thickness of the absorption layer of the perovskite material is 500 nm to 200 nm in the prior art, due to the good light-trapping effect of the first light-trapping structure 3 in the disclosure, the first absorption layer may be made relatively-thin, and is about one tenth of the thickness of the prior art, which is conducive to reducing a thickness of the top cell 2, thus facilitating lightness and thinning of the tandem photovoltaic device.

Optionally, in a condition that the second absorption layer of the bottom cell 1 is made of crystalline silicon, a thickness of the second absorption layer is less than 100 μm. Compared to that the thickness of the absorption layer of the crystalline silicon is about 150 μm in the prior art, due to the good light-trapping effect of the first light-trapping structure 3 in the disclosure, the second absorption layer may be made relatively-thin, which is conducive to reducing a thickness of the bottom cell 1, thus facilitating lightness and thinning of the tandem photovoltaic device.

Optionally, the tandem photovoltaic device further includes an upper-functional layer 9 located on the phototropic surface of the top cell 2. The upper-functional layer 9 is one or more layers, and has functions such as surface passivation, selective contact, carrier transport, or antireflection, which is do not specifically limited in the disclosure.

Optionally, the tandem photovoltaic device further includes a lower-functional layer 10 located on the shading surface of the bottom cell 1. The lower-functional layer 10 is one or more layers, and has functions such as surface passivation, selective contact, carrier transport, or antireflection. The lower-functional layer 10 may be prepared by diffusion or deposition, which is do not specifically limited in the disclosure.

The tandem photovoltaic device further includes a top electrode located on the phototropic surface of the top cell 2, and a bottom electrode located on the shading surface of the bottom cell 1.

The embodiments of the present disclosure further provide a method for producing the tandem photovoltaic device, and the method generally includes following steps:

Step 101, providing the bottom cell.

Step 102, producing the first light-trapping structure on the phototropic surface of the bottom cell, by mask evaporation.

Step 103: preparing the top cell on the phototropic surface of the first light-trapping structure, wherein the band-gap width of the top cell is larger than the band-gap width of the bottom cell.

Step 104: producing the second light-trapping structure on the side of the shading surface of the bottom cell, and/or producing the third light-trapping structure on the side of phototropic surface of the top cell. The first light-trapping structure, the second light-trapping structure, and the third light-trapping structure are all selected from metal or semiconductor material, and the localized surface plasmons generated by the first light-trapping structure, the second light-trapping structure, and the third light-trapping structure correspond to different peaks of light-wave response, respectively. The tandem photovoltaic device has the first cross section perpendicular to the phototropic surface of the tandem photovoltaic device, and the first light-trapping structure, the second light-trapping structure, and the third light-trapping structure form the discrete microstructures on the first cross section. The average sizes of the projections of the discrete microstructures on the phototropic surface of the tandem photovoltaic device are respectively d1, d2 and d3, and the average distances between adjacent microstructures thereof are respectively w1, w2 and w3. There is at least one first cross section, such that the average sizes of the projections of the microstructures on the phototropic surface of the tandem photovoltaic device and the average distances between adjacent microstructures thereof have following relationships: i.e., meet $$2 \le \left(\frac{w1}{w2}\right)^2 \cdot \frac{d2}{d1} \le 16, \text{ and/or } 2 \le \left(\frac{w3}{w1}\right)^2 \cdot \frac{d1}{d3} \le 16.$$

In the embodiments of the present disclosure, the top cell, the bottom cell, the first light-trapping structure, the second light-trapping structure, and the third light-trapping structure of the method may be referred to relevant records in the above embodiments of the tandem photovoltaic device, and may achieve the same or similar beneficial effects, which will not be repeated here to avoid repetition.

It should be noted that, for the sake of simple description, the method embodiments are all expressed as a series of action combinations. However, those skilled in the art should be aware that the embodiments of the disclosure are not limited by described action sequences, because according to the embodiments of the disclosure, certain steps may be performed in other sequences or simultaneously. Secondly, those skilled in the art should be aware as well that the embodiments described in the specification are preferable embodiments, and involved actions may not necessarily be necessary for the embodiments of the present disclosure.

Several specific embodiments are listed below to further explain the disclosure.

Embodiment 1

Referring to that shown in FIG. 5, the second absorption layer of the bottom cell 1 is crystalline silicon, and the bottom cell 1 utilizes an n-type silicon substrate with a thickness of 50 µm. A phototropic surface of the substrate is a planar structure (polished or unpolished), and a shading surface thereof is a suede-light-trapping structure. A p-type layer is diffused on the shading surface of the crystalline-silicon substrate, to form the bottom cell 1. The shading surface of the bottom cell 1 has the lower-functional layer 10, and the lower-functional layer 10 is a structure of one or more layers, and has functions of surface passivation and antireflection. A selectively-contacting structure, which is locally-heavy doped, may present at positions corresponding to the bottom electrode. The lower-functional layer 10 may be a p-type polycrystalline transport layer or p-type amorphous silicon. In this condition, there is an interface layer of silicon oxide or intrinsic amorphous silicon between the bottom cell 1 and the lower-functional layer 10. At the same time, the lower-functional layer 10 includes a conductive thin-film transmission layer, such as indium-doped tin oxide or aluminum-doped zinc oxide.

The phototropic surface of the bottom cell 1 may have a diffused or deposited field-effect layer or passivation layer. Alternatively, a localized passivation layer such as silicon oxide, may present at contacting positions of the first light-trapping structure 3.

There is the first light-trapping structure 3 on the phototropic surface of the bottom cell 1, and the discrete microstructures of the first light-trapping structure 3 formed on the first cross section are silver nanoparticles. The silver nanoparticle is approximately a cylinder with an average diameter of 30 nm to 200 nm, a height of the cylinder is approximately equal to the diameter thereof, and a ball distance thereof is 20 nm to 500 nm (for example, specifically, the diameter of the silver nanoparticle is 50 nm, the height thereof is 50 nm, and the distance between adjacent particles is 80 nm), which is not a perfect cylinder and is slightly tapered. The microstructures form a uniformly-distributed lattice structure. The microstructures are formed and obtained by utilizing mask evaporation. In addition, nanoparticles composed of one or more materials such as gold, aluminum, copper, gallium, and indium may be utilized as well.

The gaps among the nanoparticles of the first light-trapping structure 3 are filled with the dielectric layer 7, and the dielectric layer 7 is made of aluminum oxide with a thickness of 5 nm to 20 nm (the thickness thereof does not exceed the height of the nanoparticles or the first light-trapping structure 3. If the height of the first light-trapping structure 3 is 100 nm, the thickness of aluminum oxide is not larger than 100 nm).

The top cell 2 is deposited on the first light-trapping structure 3. In the embodiment, the first absorption layer of the top cell 2 is wide-band-gap perovskite. The substrate 21 of the top cell 2 includes a perovskite absorption layer, a C60 electron transport layer, and a nickel-oxide hole-transport layer. There is a lower-transport layer 22 of the top cell 2 between the nickel-oxide hole-transport layer and the first light-trapping structure 3, and an upper-transport layer 23 is provided on the phototropic surface of the substrate 21. The upper-transport 23 is an electron-transport layer. The thickness of the top cell 2 is 50 nm to 300 nm.

The upper-functional layer 9 presents on the phototropic surface of the top cell, which is a structure of one or more layers and play a role of surface antireflection.

The side of the shading surface of the bottom cell 1 has the second light-trapping structure and the side of the phototropic surface of the top cell 2 has the third light-trapping structure 4. The discrete microstructures of the second light-trapping structure 5 and the third light-trapping structure 4 formed on the first cross section, are nanoparticles as well. The nanoparticles are made of a silver material, or one or more materials such as gold, aluminum, copper, gallium, and indium. The materials of the nanoparticles in the three layers of light-trapping structures may be the same or different from each other. As the embodiment 1, the microstructure of the third light-trapping structure is approximately a cylinder, with an average diameter of 30 nm, a height of 30 nm, and an average distance of 50 nm, and the microstructure of the second light-trapping structure is approximately a cylinder, with an average diameter of 100 nm, a height of 100 nm, and an average distance of 1 µm.

Further, in order to achieve a better overall light-trapping effect, the average sizes d1, d2, d3 respectively corresponding to the first light-trapping structure 3, the second light-trapping structure 5, and the third light-trapping structure 4, and the average distances w1, w2, and w3 respectively corresponding thereto, have following relationship:

$$\left(\frac{w1}{w2}\right)^2 \cdot \frac{d2}{d1} = 8, \text{ and/or } \left(\frac{w3}{w1}\right)^2 \cdot \frac{d1}{d3} = 4.$$

As a preferable solution in the embodiment 1, the third light-trapping structure and the first light-trapping structure satisfy the relationship, $$\left(\frac{w3}{w1}\right)^2 \cdot \frac{d1}{d3} = 4.$$

When the microstructures of the first light-trapping structure are silver nanoparticles with a diameter of 50 nm and a distance between adjacent particles is 80 nm, the microstructures of the third light-trapping structure may be silver nanoparticles with a diameter of 20 nm and an average distance thereof is 102 nm, and the size of the microstructures of the second light-trapping structure is not limited.

As a preferable solution in the embodiment 1, the second light-trapping structure and the first light-trapping structure satisfy the relationship, $$\left(\frac{w1}{w2}\right)^2 \cdot \frac{d2}{d1} = 8.$$

When the microstructures of the first light-trapping structure are silver nanoparticles with a diameter of 50 nm and a distance between adjacent particles is 100 nm, the microstructures of the second light-trapping structure may be silver nanoparticles with a diameter of 1000 nm and an average distance thereof is 167 nm, and the size of the microstructures of the third light-trapping structure is not limited.

As a more preferable solution in the embodiment 1, both $$\left(\frac{w3}{w1}\right)^2 \cdot \frac{d1}{d3} = 4 \text{ and } \left(\frac{w1}{w2}\right)^2 \cdot \frac{d2}{d1} = 8$$

are satisfied. When the microstructures of the first light-trapping structure are silver nanoparticles with a diameter of 50 nm and a distance between adjacent particles is 100 nm, the microstructures of the second light-trapping structure may be silver nanoparticles with a diameter of 1000 nm and an average distance thereof is 167 nm, and the microstructures of the third light-trapping structure may be silver nanoparticles with a diameter of 20 nm and an average distance thereof is 89 nm.

Embodiment 2

Figure 6:
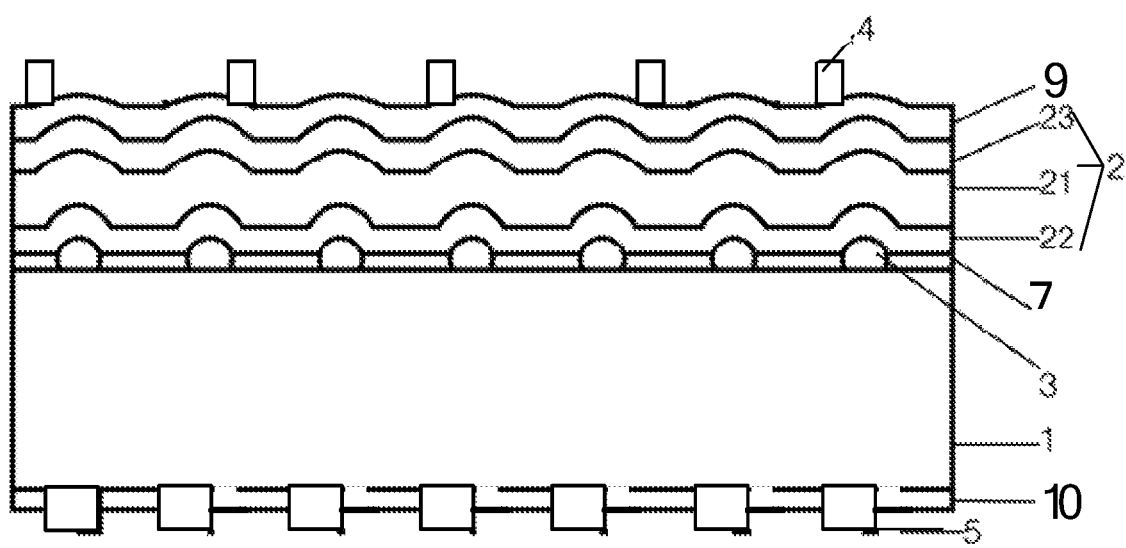
FIG. 6 is a schematic diagram showing a third type of first cross section perpendicular to a phototropic surface of a tandem photovoltaic device in an embodiment of the present disclosure.

Referring to that shown in FIG. 6, FIG. 6 is a schematic diagram showing a third type of first cross section perpendicular to the phototropic surface of the tandem photovoltaic device in an embodiment of the present disclosure. The second absorption layer of the bottom cell 1 is a crystalline silicon solar cell, and the bottom cell 1 utilizes an n-type silicon substrate with a thickness of 10 µm. A phototropic surface of the substrate has a planar structure (polished or unpolished), and a shading surface thereof is a planar structure (polished or unpolished). A p-type layer is diffused on the shading surface of the crystalline-silicon substrate, to form the bottom cell 1. The shading surface of the bottom cell 1 has the lower-functional layer 10, and the lower-functional layer 10 is a structure of one or more layers, and has functions of surface passivation and antireflection. The lower-functional layer 10 may be a p-type polycrystalline transport layer or p-type amorphous silicon. In this condition, there is an interface layer of silicon oxide or intrinsic amorphous silicon between the bottom cell 1 and the lower-functional layer 10. At the same time, the lower-functional layer 10 includes a conductive thin-film transmission layer, such as indium-doped tin oxide or aluminum-doped zinc oxide.

The second light-trapping structure 5 is set on the side of the shading surface of the bottom cell 1. For example, the second light-trapping structure 5 adopts holes in the lower-functional layer 10. Metal aluminum may be adopted to fill the holes, and be led out, as a back electrode.

The phototropic surface of the bottom cell 1 may have a diffused or deposited field-effect layer or passivation layer. Alternatively, a localized passivation layer such as silicon oxide, may present at contacting positions of the first light-trapping structure 3.

There is the first light-trapping structure 3 on the phototropic surface of the bottom cell 1. The discrete microstructures of the first light-trapping structure 3 formed on the first cross section are silver nanoparticles. The silver nanoparticle is approximately a hemispherical body with an average spherical diameter of 50 nm to 200 nm, a height of the hemispherical body is approximately equal to a half of the spherical diameter, and a spherical distance thereof is 20 nm to 500 nm (for example, a specific embodiment is a diameter of 50 nm, a height of 25 nm, and a distance of 80 nm), which is not a perfect hemispherical body. The microstructures form a uniformly-distributed lattice structure. The microstructures are formed and obtained by annealing after mask evaporation.

The dielectric layer 7 presents in gaps or distances among the nanoparticles, and the dielectric layer 7 is made of silicon oxide with a thickness of 5 nm to 20 nm (the thickness thereof does not exceed the height of the first light-trapping structure 3. If the height of the first light-trapping structure 3 is 50 nm, the thickness of silicon oxide is not larger than 50 nm).

The top cell 2 is deposited on the first light-trapping structure 3. In the embodiment, the first absorption layer of the top cell 2 is wide-band-gap perovskite, and 21 is the substrate of the top cell 2. The substrate 21 of the top cell 2 includes a perovskite absorption layer 21, a C60 electron transport layer, and a nickel-oxide hole-transport layer. There is a lower-transport layer 22 of the top cell between the nickel-oxide hole-transport layer and the first light-trapping structure 3, and an upper-transport layer 23 is provided on the phototropic surface of the substrate 21. The upper-transport 23 is an electron-transport layer. The thickness of the top cell 2 is 50 nm to 300 nm.

The upper-functional layer 9 presents on the phototropic surface of the top cell 2, which is a structure of one or more layers and play a role of surface antireflection.

The side of the phototropic surface of the top cell 2 has the third light-trapping structure 4. The discrete microstructures of the third light-trapping structure 4 formed on the first cross section, are nanoparticles as well.

As a preferable solution in the embodiment 2, the average sizes d1, d2, d3 respectively corresponding to the first light-trapping structure 3, the second light-trapping structure 5, and the third light-trapping structure 4, and the average distances w1, w2, and w3 respectively corresponding thereto, have following relationship:

$$\left(\frac{w1}{w2}\right)^2 \cdot \frac{d2}{d1} = 2, \text{ and/or } \left(\frac{w3}{w1}\right)^2 \cdot \frac{d1}{d3} = 16.$$

For example, if the first light-trapping structure has a size of 50 nm and a distance of 80 nm, the second light-trapping structure has a size of 200 nm and a distance of 112 nm, and the third light-trapping structure has a size of 50 nm and a distance of 320 nm.

Embodiment 3

Figure 7:
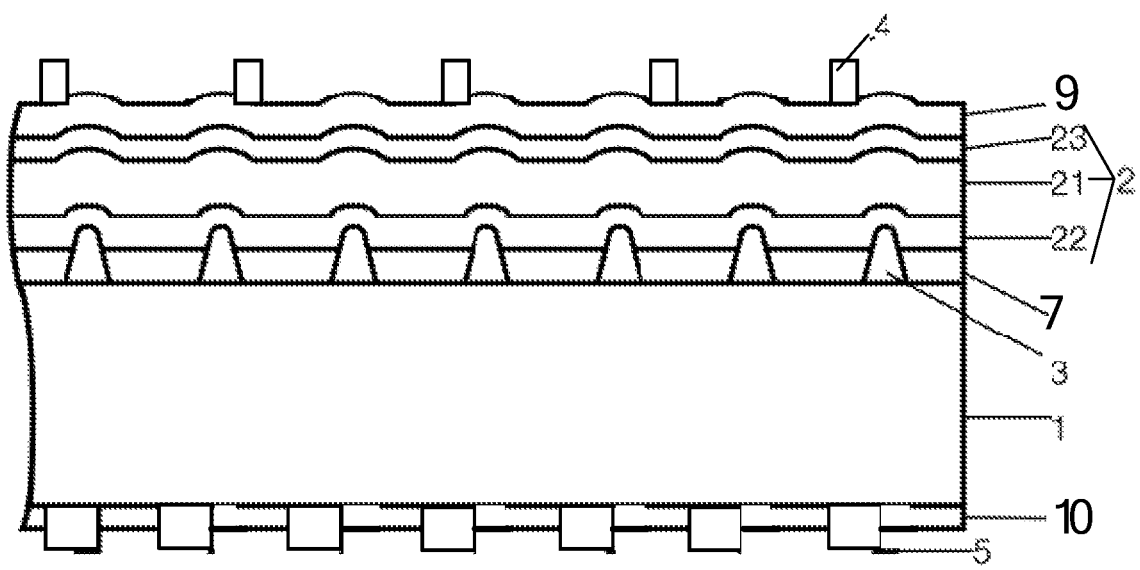
FIG. 7 is a schematic diagram showing a fourth type of first cross section perpendicular to a phototropic surface of a tandem photovoltaic device in an embodiment of the present disclosure.

Referring to that shown in FIG. 7, FIG. 7 is a schematic diagram showing a fourth type of first cross section perpendicular to the phototropic surface of the tandem photovoltaic device in an embodiment of the present disclosure. The second absorption layer of the bottom cell 1 is crystalline silicon, and the bottom cell 1 utilizes an n-type silicon substrate with a thickness of 10 μm. A phototropic surface of the substrate has a planar structure (polished or unpolished), and a shading surface thereof is a planar structure (polished or unpolished). A p-type layer is diffused on the shading surface of the crystalline-silicon substrate, to form the bottom cell 1. The shading surface of the bottom cell 1 has the lower-functional layer 10, and the lower-functional layer 10 is a structure of one or more layers, and has functions of surface passivation and antireflection. The lower-functional layer 10 may be a p-type polycrystalline transport layer or p-type amorphous silicon. In this condition, there is an interface layer of silicon oxide or intrinsic amorphous silicon between the bottom cell 1 and the lower-functional layer 10. At the same time, the lower-functional layer 10 includes a conductive thin-film transmission layer, such as indium-doped tin oxide or aluminum-doped zinc oxide.

The second light-trapping structure 5 is set on the side of the shading surface of the bottom cell 1. For example, the second light-trapping structure 5 adopts holes in the lower-functional layer 10. Metal aluminum may be adopted to fill the holes, and be led out, as a back electrode.

The phototropic surface of the bottom cell 1 may have a diffused or deposited field-effect layer or passivation layer. Alternatively, a localized passivation layer such as silicon oxide, may present at contacting positions of the first light-trapping structure 3. There is the first light-trapping structure 3 on the phototropic surface of the bottom cell 1. The discrete microstructures of the first light-trapping structure 3 formed on the first cross section are parallel lines. The microstructure utilizes silver or an alloy material of silver, and has a cross section approximately rectangular or trapezoidal, a width of bottom (an area in contact with the phototropic surface of the bottom cell 1) of 80 nm, and a height of 50 nm, and a distance between adjacent parallel lines is 200 nm to 500 nm. The microstructure is obtained by utilizing mask evaporation. Alternatively, the width of bottom thereof is 200 nm, and the distance thereof is 500 nm.

There is the dielectric layer 7 in gaps between adjacent parallel lines, the dielectric layer 7 is made of silicon oxide and has a thickness of 5 nm to 20 nm. The silicon oxide layer may be a same layer with a passivation layer of the phototropic surface of the bottom cell 1.

The top cell 2 is deposited on the first light-trapping structure 3. In this embodiment, the first absorption layer of the top cell 2 is wide-band-gap gallium arsenide, and 21 is the substrate of the top cell 2. The substrate 21 includes a p-type gallium arsenide absorption layer and an n-type gallium arsenide emission layer. There is the lower-transport layer 22 of the top cell 2 between the p-type gallium arsenide absorption layer and the first light-trapping structure 3. At the same time, 22 acts as a buffer for lattice mismatch, and is an aluminum gallium arsenic compound. The upper-transport 23 is set on the phototropic surface of the substrate 21, at the same time, the upper-transport 23 is a window layer of a gallium arsenide solar cell, and is an aluminum indium phosphorus compound. The thickness of the top cell 2 is 200 nm to 500 nm.

The upper-functional layer 9 presents on the phototropic surface of the top cell 2, which is a structure of one or more layers and play a role of surface antireflection.

The side of the phototropic surface of the top cell 2 has the third light-trapping structure 4. The discrete microstructures of the third light-trapping structure 4 formed on the first cross section, are nanoparticles as well.

As a preferable solution in the embodiment 3, the average sizes d1, d2, d3 respectively corresponding to the first light-trapping structure 3, the second light-trapping structure 5, and the third light-trapping structure 4, and the average distances w1, w2, and w3 respectively corresponding thereto, have following relationship:

$$\left(\frac{w1}{w2}\right)^2 \cdot \frac{d2}{d1} = 16, \text{ and/or } \left(\frac{w3}{w1}\right)^2 \cdot \frac{d1}{d3} = 2.$$

For example, if the first light-trapping structure has a size of 200 nm and a distance of 500 nm, the second light-trapping structure has a size of 800 nm and a distance of 250 nm, and the third light-trapping structure has a size of 100 nm and a distance of 500 nm.

According to the embodiments of the disclosure, after the light is incident on the tandem photovoltaic device, the light enters a lower part of the first light-trapping structure through scattering, and undergoes a plurality of reflections, which may increase an optical path thereof to a certain extent. At the same time, free electrons in the first light-trapping structure may be coupled with incident light, forming a multimode-resonant-light-trapping effect. On the one hand, the first light-trapping structure is coupled to the incident light, to generate a phenomenon of localized-plasma-mode enhancement located on a surface of the first light-trapping structure. The incident light is restricted by the localized-plasma-mode enhancement, thus presenting in a peripheral region of the surface of the first light-trapping structure, which produces a light-trapping effect. On the other hand, the first light-trapping structure is coupled to the incident light, generating surface plasmons that convert the incident light into a waveguide mode that transmits laterally, which changes a transmitting direction of the incident light, and greatly increases the optical path of the incident light, which may effectively improve the light-trapping effect, thus, an excellent light-absorbing effect may be achieved through a relatively-small thickness of the absorption layer, which may reduce thicknesses of the absorption layers in the respective cells, thereby reducing thicknesses of the respective cells, thus reducing an overall thickness of the tandem photovoltaic device. After the light is incident on the second light-trapping structure and/or the third light-trapping structure, the free electrons in the second light-trapping structure and/or the third light-trapping structure may be couple with the incident light, forming a multimode-resonant-light-trapping effect, which improves absorption of the incident light. At the same time, the second light-trapping structure forms the multimode-resonant-light-trapping effect for the light of wave band of relatively-long wavelength in the bottom cell, and the third light-trapping structure forms the multimode-resonant-light-trapping effect for the light of wave band of relatively-short wavelength in the top cell, thus improving the absorption of incident light. The localized surface plasmons generated by the first light-trapping structure, the second light-trapping structure, and the third light-trapping structure correspond to different peaks of light-wave response, respectively. Thus, through cooperation of the three, the incident light in almost all of wavelength ranges is fully utilized, thus improving the absorption of the incident light. The average sizes and the average distances of the first light-trapping structure, the second light-trapping structure, and the third light-trapping structure are respectively d1, d2 and d3, and w1, w2 and w3, and have following relationships:

$$2 \le \left(\frac{w1}{w2}\right)^2 \cdot \frac{d2}{d1} \le 16, \text{ and/or } 2 \le \left(\frac{w3}{w1}\right)^2 \cdot \frac{d1}{d3} \le 16,$$

to make the scattering cross sections of every two adjacent layers of light-trapping structures both match corresponding wavelengths, which may fully guarantee incoming amount of the incident light, and make less light reflected from the tandem photovoltaic device, thus further improving the absorption of the incident light.

The embodiments of the present disclosure have been described as the above in combination with the accompanying drawings, but the present disclosure is not limited to the specific embodiments described above. The specific embodiments described above are only illustrative, not restrictive. With the enlightenment of the present disclosure, those ordinary skilled in the art may make many forms without departing from purposes of the present disclosure and the scope protected by the claims, all of which fall within the protection of the present disclosure.

The invention claimed is:

1. A tandem photovoltaic device, comprising: a top cell, a bottom cell, and a first light-trapping structure located between the top cell and the bottom cell, which are set in stacking, wherein a band-gap width of the top cell is larger than a band-gap width of the bottom cell;
   the tandem photovoltaic device further comprises at least one of a second light-trapping structure located on a side of a shading surface of the bottom cell and a third light-trapping structure located on a side of a phototropic surface of the top cell;
   the first light-trapping structure, the second light-trapping structure, and the third light-trapping structure are respectively selected from any one of metal or semiconductor material, and localized surface plasmons generated by the first light-trapping structure, the second light-trapping structure, and the third light-trapping structure respectively correspond to different peaks of light-wave response;
   the tandem photovoltaic device has a first cross section perpendicular to a phototropic surface of the tandem photovoltaic device, the first light-trapping structure, the second light-trapping structure, and the third light-trapping structure form discrete microstructures on the first cross section, average sizes of projections of the discrete microstructures on the phototropic surface of the tandem photovoltaic device are respectively d1, d2 and d3, and average distances between adjacent discrete microstructures thereof are respectively w1, w2 and w3; and
   at least one first cross section presents, such that the average sizes of projections of the discrete microstructures on the phototropic surface of the tandem photovoltaic device and the average distances between the adjacent discrete microstructures have following relationships:

$$2 \le \left(\frac{w1}{w2}\right)^2 \cdot \frac{d2}{d1} \le 16, \text{ and/or } 2 \le \left(\frac{w3}{w1}\right)^2 \cdot \frac{d1}{d3} \le 16.$$

2. The tandem photovoltaic device according to claim 1, wherein the discrete microstructure of first light-trapping structure, the second light-trapping structure, and the third light-trapping structure is selected from a particle, a line, or a hole.

3. The tandem photovoltaic device according to claim 2, wherein a shape of the particle is one of spherical, hemispherical, linear cross structure, cylinder, and cone, and a shape of the hole is one of circle, approximately circle, and polygonal shape.

4. The tandem photovoltaic device according to claim 1, wherein the top cell comprises a first absorption layer, the bottom cell comprises a second absorption layer, and a distance between the first light-trapping structure and at least the first absorption layer or the second absorption layer is not larger than 2 nm.

5. The tandem photovoltaic device according to claim 1, wherein the tandem photovoltaic device further comprises a dielectric layer, and the dielectric layer is formed of dielectric material filled in gaps among the discrete microstructures of the first light-trapping structure; and
   a height of the first light-trapping structure is larger than or equal to a height of the dielectric layer.

6. The tandem photovoltaic device according to claim 1, wherein the peak of light-wave response of the localized surface plasmons of the first light-trapping structure is within a wavelength range of absorbed light of the bottom cell, and the peak of light-wave response of the localized surface plasmons of the third light-trapping structure is within a wavelength range of absorbed light of the top cell.

7. A tandem photovoltaic device, comprising: a top cell, a bottom cell, and a first light-trapping structure located between top cell and the bottom cell, which are set in stacking, wherein a band-gap width of the top cell is larger than a band-gap width of the bottom cell;

the tandem photovoltaic device further comprises at least one of a second light-trapping structure located on a side of a shading surface of the bottom cell and a third light-trapping structure located on a side of a phototropic surface of the top cell; and the first light-trapping structure, the second light-trapping structure, and the third light-trapping structure are respectively selected from any one of metal or semiconductor material, and localized surface plasmons generated by the first light-trapping structure, the second light-trapping structure, and the third light-trapping structure respectively correspond to different peaks of light-wave response.

8. The tandem photovoltaic device according to claim 7, wherein the tandem photovoltaic device has a first cross section perpendicular to a phototropic surface of the tandem photovoltaic device, the first light-trapping structure, the second light-trapping structure, and the third light-trapping structure form discrete microstructures on the first cross section, and average sizes of projections of the discrete microstructures on the phototropic surface of the tandem photovoltaic device are respectively d1, d2 and d3; and at least one first cross section presents, such that the average sizes of projections of the discrete microstructures on the phototropic surface of the tandem photovoltaic device has following relationship:

d3<d1<d2.

9. The tandem photovoltaic device according to claim 7, wherein the discrete microstructure of first light-trapping structure, the second light-trapping structure, and the third light-trapping structure is selected from a particle, a line, or a hole.

10. The tandem photovoltaic device according to claim 9, wherein a shape of the particle is one of spherical, hemispherical, linear cross structure, cylinder, and cone, and a shape of the hole is one of circle, approximately circle, and polygonal shape.

11. The tandem photovoltaic device according to claim 7, wherein the top cell comprises a first absorption layer, the bottom cell comprises a second absorption layer, and a distance between the first light-trapping structure and at least the first absorption layer or the second absorption layer is not larger than 2 nm.

12. The tandem photovoltaic device according to claim 7, wherein the tandem photovoltaic device further comprises a dielectric layer, and the dielectric layer is formed of dielectric material filled in gaps among the discrete microstructures of the first light-trapping structure; and a height of the first light-trapping structure is larger than or equal to a height of the dielectric layer.

13. The tandem photovoltaic device according to claim 7, wherein the peak of light-wave response of the localized surface plasmons of the first light-trapping structure is within a wavelength range of absorbed light of the bottom cell, and the peak of light-wave response of the localized surface plasmons of the third light-trapping structure is within a wavelength range of absorbed light of the top cell.

14. A tandem photovoltaic device, comprising: a top cell, a bottom cell, and a first light-trapping structure located between the top cell and the bottom cell, which are set in stacking, wherein a band-gap width of the top cell is larger than a band-gap width of the bottom cell;

the tandem photovoltaic device further comprises a second light-trapping structure located on a side of a shading surface of the bottom cell or a third light-trapping structure located on a side of a phototropic surface of the top cell;

the first light-trapping structure is selected from any one of metal or semiconductor material, the second light-trapping structure or the third light-trapping structure are respectively selected from any one of the metal or the semiconductor material, localized surface plasmons generated by the first light-trapping structure and the second light-trapping structure respectively correspond to different peaks of light-wave response, and localized surface plasmons generated by the first light-trapping structure and the third light-trapping structure respectively correspond to different peaks of light-wave response;

the tandem photovoltaic device has a first cross section perpendicular to a phototropic surface of the tandem photovoltaic device, the first light-trapping structure, the second light-trapping structure, and the third light-trapping structure form discrete microstructures on the first cross section, average sizes of projections of the discrete microstructures on the phototropic surface of the tandem photovoltaic device are respectively d1, d2 and d3, and average distances between adjacent discrete microstructures thereof are respectively w1, w2 and w3; and at least one first cross section presents, such that the average sizes of projections of the discrete microstructures on the phototropic surface of the tandem photovoltaic device and the average distances between the adjacent discrete microstructures have following relationship:

$$1.2 \leq \left(\frac{w1}{w2}\right)^2 \cdot \frac{d2}{d1} \leq 20, \text{ or } 1.2 \leq \left(\frac{w3}{w1}\right)^2 \cdot \frac{d1}{d3} \leq 20.$$

15. The tandem photovoltaic device according to claim 14, wherein the average sizes of projections of the discrete microstructures on the phototropic surface of the tandem photovoltaic device and the average distances between the adjacent discrete microstructures have following relationships:

$$2 \leq \left(\frac{w1}{w2}\right)^2 \cdot \frac{d2}{d1} \leq 16, \text{ or } 2 \leq \left(\frac{w3}{w1}\right)^2 \cdot \frac{d1}{d3} \leq 16.$$

16. The tandem photovoltaic device according to claim 14, wherein the discrete microstructure of first light-trapping structure, the second light-trapping structure, and the third light-trapping structure is selected from a particle, a line, or a hole.

17. The tandem photovoltaic device according to claim 16, wherein a shape of the particle is one of spherical, hemispherical, linear cross structure, cylinder, and cone, and a shape of the hole is one of circle, approximately circle, and polygonal shape.

18. The tandem photovoltaic device according to claim 14, wherein the top cell comprises a first absorption layer, the bottom cell comprises a second absorption layer, and a distance between the first light-trapping structure and at least the first absorption layer or the second absorption layer is not larger than 2 nm.

19. The tandem photovoltaic device according to claim 14, wherein the tandem photovoltaic device further comprises a dielectric layer, and the dielectric layer is formed of dielectric material filled in gaps among the discrete microstructures of the first light-trapping structure; and a height of the first light-trapping structure is larger than or equal to a height of the dielectric layer.

20. The tandem photovoltaic device according to claim 14, wherein the peak of light-wave response of the localized surface plasmons of the first light-trapping structure is within a wavelength range of absorbed light of the bottom cell, and the peak of light-wave response of the localized surface plasmons of the third light-trapping structure is within a wavelength range of absorbed light of the top cell.

* * * * *